United States Patent
Liu et al.

(10) Patent No.: US 7,189,650 B2
(45) Date of Patent: Mar. 13, 2007

(54) METHOD AND APPARATUS FOR COPPER FILM QUALITY ENHANCEMENT WITH TWO-STEP DEPOSITION

(75) Inventors: Chi-Wen Liu, Hsinchu (TW); Hsien-Ping Feng, Youghe (TW); Jung-Chih Tsao, Taipei (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 10/987,713

(22) Filed: Nov. 12, 2004

(65) Prior Publication Data

US 2006/0105565 A1    May 18, 2006

(51) Int. Cl.
*H01L 21/44* (2006.01)

(52) U.S. Cl. ............ 438/687; 438/633; 438/638; 438/660; 257/E21.579; 257/E21.586

(58) Field of Classification Search .......... 438/633, 438/638, 643, 663, 660, 687, FOR. 355, 438/FOR. 489; 257/E21.579, E21.586
See application file for complete search history.

(56) References Cited

U.S. PATENT DOCUMENTS

| | | | |
|---|---|---|---|
| 5,948,467 A | 9/1999 | Nguyen et al. | |
| 6,022,808 A * | 2/2000 | Nogami et al. | 438/694 |
| 6,077,780 A | 6/2000 | Dubin | |
| 6,221,765 B1 | 4/2001 | Ueno | |
| 6,245,670 B1 | 6/2001 | Cheung et al. | |
| 6,350,364 B1 | 2/2002 | Jang | |
| 6,350,688 B1 * | 2/2002 | Liu et al. | 438/687 |
| 6,358,840 B1 * | 3/2002 | Wang et al. | 438/631 |
| 6,380,084 B1 * | 4/2002 | Lim et al. | 438/687 |
| 6,391,777 B1 | 5/2002 | Chen et al. | |
| 6,451,682 B1 | 9/2002 | Fujikawa et al. | |
| 6,582,569 B1 | 6/2003 | Chiang et al. | |
| 7,030,016 B2 | 4/2006 | Feng et al. | |
| 2002/0130046 A1 * | 9/2002 | Cheung et al. | 205/104 |
| 2003/0140988 A1 | 7/2003 | Giandikota et al. | |
| 2004/0072423 A1 * | 4/2004 | Jorne et al. | 438/687 |
| 2005/0095847 A1 | 5/2005 | Kunishima et al. | |

OTHER PUBLICATIONS

U.S. Appl. No. 11/347,949, filed Feb. 6, 2006, Feng et al.

* cited by examiner

*Primary Examiner*—Michelle Estrada
(74) *Attorney, Agent, or Firm*—Duane Morris LLP (57) ABSTRACT

The disclosure relates to a method and apparatus for enhancing copper film quality with a two-step deposition. The two step deposition may include depositing a first copper film by electrochemical plating, annealing the first copper film at a desired temperature for a duration of time to remove any impurities, depositing a second copper film and annealing the second copper film for a duration of time to remove impurities. The second copper film can be deposited by electrochemical plating without HCl/C-based additive. The second copper film can also be deposited by sputtering to avoid impurities including C, Cl and S.

28 Claims, 12 Drawing Sheets

METHOD AND APPARATUS FOR COPPER FILM QUALITY ENHANCEMENT WITH TWO-STEP DEPOSITION

The disclosure generally relates to a method and apparatus for providing copper interconnects with improved performance.

BACKGROUND

Copper has been used extensively in the electronics industry. Indeed, copper has been replacing aluminum as the basic metallization for integrated circuits (ICs). Copper provides a higher electroconductivity as compared, for example, with aluminum. Copper also has a higher resistance to electro-migration than aluminum, making copper a desirable replacement for aluminum. The higher electrical conductivity reduces resistive losses and provides for faster switching needed for advanced ICs.

A well established process for fabricating copper circuitry on semiconductor chips is the so-called Damascene process. Under this process, vias are etched through and trenches are etched in the chip's dielectric material (typically silicon dioxide) although materials with lower dielectric constants are desirable. A barrier layer such as titanium nitride (TiN) or tantalum nitride (TaN), is then deposited into the trenches and vias by reactive sputtering to prevent Cu migration into the dielectric material and degradation of the device performance. A thin sputtered copper seed layer is next deposited to facilitate copper electrodeposition. Copper is then electrodeposited into the trenches and vias. Copper deposited on the outer surface, i.e., outside of the trenches and vias, is removed by chemical mechanical polishing (CMP). The "dual Damascene" process involves deposition in both trenches and vias at the same time.

Integrated circuits (ICs) typically include metal wirings connecting different regions of the circuit. The metal wirings are insulated by a dielectric material in order to prevent capacitance coupling, leakage or cross-talk between the electrical pathways. Metal wirings forming the interlevel connection are commonly referred to as interconnects and are formed by depositing a metal in an opening such as a via, a hole or a trench. The metallic interconnect is typically deposited using damascene or a dual damascene technique.

In depositing the metallic interconnect, a diffusion barrier is formed on the sidewalls of the dielectric layer in the via before depositing the metal interconnect. The barrier layers prevent the metal from corrosion. The barrier layers also prevent migration of metal ions into the dielectric layer.

Another concern in depositing the metallic interconnect is the purity of the metallic interconnect. As the width of vias and trenches shrink, voids occur in the interconnect. Voids can form within vias during metal deposition and cause reliability issues. Purity in the interconnect ensures reliability and high performance. Copper is commonly deposited by electroless or electroplating techniques that typically include a solution containing sulfate and chloride ions. Small amounts of these ions are frequently trapped inside the deposited copper layer and the resulting S and Cl impurity can lead to corrosion and reduced performance. Therefore, a copper deposition method is needed to minimize interconnect impurities.

SUMMARY OF THE DISCLOSURE

In one embodiment, the disclosure relates to a method for providing copper film quality enhancement with two-step deposition. The method includes providing a substrate; forming a trench in said substrate and depositing a conductive layer on said substrate. Optionally, a diffusion-barrier layer can be interposed between the substrate and the conductive layer that fills the trench. Next, an etch-stop layer can be deposited on the substrate followed by a dielectric layer. A trench having a via can be formed in the dielectric layer. The via can be extended through the etch-stop layer to expose the conductive layer. Next, a diffusion barrier layer is formed to cover the exposed first conductive layer as well as the walls of the via and the trench. A copper seed layer is then deposited in the via. Using a first ECP process, the first copper layer can be deposited to fill the via followed by a first anneal process. A second copper layer may be applied using a second ECP processes to fill the trench. The second ECP process may be followed by a second anneal process.

DETAILED DESCRIPTION OF THE DISCLOSURE

Figure 1:
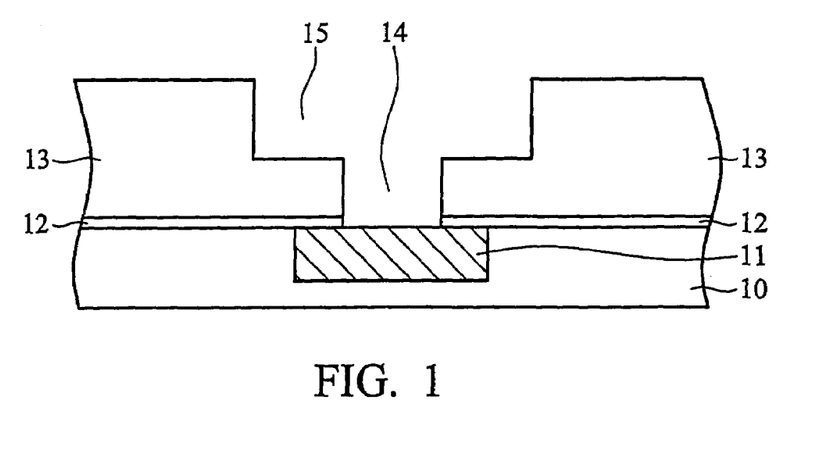
FIG. 1 is a schematic illustration of a substrate having a dielectric layer deposited thereon.

FIG. 1 is a schematic illustration of a substrate having a dielectric layer deposited thereon. In FIG. 1, a substrate 10 is provided that typically includes active and passive devices as well as conductive and dielectric layers that are not shown in order to simplify the drawing. Substrate 10 may include silicon or silicon-germanium, gallium-arsenide, or silicon-on-insulator technology. A conductive layer 11 is formed on substrate 10 by conventional means. Conductive layer 11 may include a metal such as Al, Cu, W, or an Al/Cu alloy. Optionally, conductive layer 11 is deposited on a diffusion barrier layer (not shown) within substrate 10 in order to protect the conductive layer from trace amounts of impurities in substrate 10 that may cause corrosion or oxidation of conductive layer 11. A diffusion barrier layer can also prevent metal ions in conductive layer 11 from diffusing into substrate 10 and diminishing the insulating capability of adjacent dielectric layers. The surface of conductive layer 11 can be planarized to be coplanar with substrate 10.

An etch-stop layer 12 can optionally be deposited on substrate 10. Etch stop layer 12 can be silicon carbide, silicon oxynitride or silicon nitride. The etch-stop layer can be deposited using a conventional chemical vapor deposition (CVD) process or by a plasma enhanced CVD technique. A dielectric layer 13 is then formed on the etch-stop layer 12 by a CVD, plasma enhanced CVD, or by a spin-on method and is comprised of $SiO_2$, phosphosilicate glass (PSG), borophosphosilicate glass (BPSG), or a material with a low dielectric constant ("k") such as fluorine doped $SiO_2$, carbon doped $SiO_2$, a polysilsesquioxane, a poly(aryl ether), or a fluorinated polyimide. When dielectric layer 13 contains a porous, low k dielectric material, the dielectric layer 13 may be subjected to further processing such as heating or a plasma treatment to increase the density of the layer.

Optionally, a cap layer (not shown) such as silicon oxynitride or silicon nitride can be deposited on dielectric layer 13 to form the top layer in a dielectric stack of layers. In an alternative embodiment, the dielectric stack of layers can be formed by sequentially depositing a first etch stop layer, a first dielectric layer, a second etch stop layer (not shown), a second dielectric layer (not shown) and a cap layer as previously described.

A conventional sequence of steps that includes patterning a photoresist layer (not shown) and using the photoresist as an etch mask while transferring the pattern into the underlying dielectric layer can also be employed to produce a via 14. A similar sequence of steps can be carried out to fabricate a trench 15 overlying via 14. It is also noted that other dual damascene designs are possible in addition to a trench 15 that is centered over a via 14 as in FIG. 1. For example, one trench may be aligned above two or more vias. Furthermore, the trench 15 may not be centered over the via 14 but offset to one side of the via 14 while still uncovering the entire via opening. Note that via 14 extends through etch stop layer 12 to expose underlying conductive layer 11. A standard cleaning process may be performed after the etch steps that form via 14 and trench 15 in order to remove any residue on conductive layer 11 or on etch stop layer 12 and dielectric layer 13.

Figure 2:
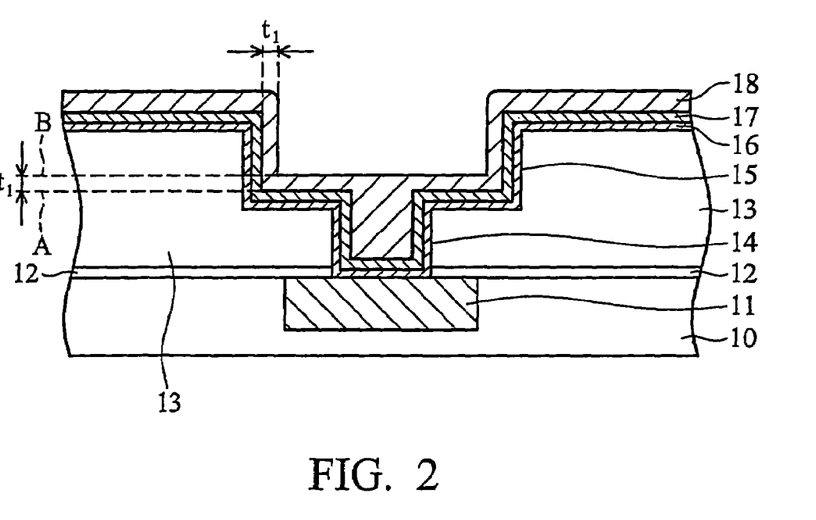
FIG. 2 shows the substrate of FIG. 1 having a first copper layer deposited thereon.

Referring to FIG. 2, a conformal diffusion barrier layer 16 can be deposited on the sidewalls and bottom of via 14 and trench 15. Diffusion barrier layer 16 can be deposited by a CVD, plasma enhanced CVD, or an atomic layer deposition (ALD) method. The diffusion barrier layer 16 may include Ta, TaN, Ti, TiN, TaSiN, W, or WN or a composite layer of two or more of the aforementioned materials.

A copper seed layer 17 can then be formed on diffusion barrier layer 16 in order to promote the deposition of a thicker first copper layer 18 in a subsequent step. The copper seed layer 17 can be deposited by a physical vapor deposition (PVD) process or by an ionized metal plasma (IMP) sputtering method. The copper seed layer 17 can have a uniform thickness to conform to the shape of diffusion barrier layer 16.

A first copper layer 18 can be deposited by a first electrochemical plating (ECP) process on copper seed layer 17. An exemplary ECP process involves an electroplating composition having current density of about 3–60 $A/cm^2$. The plating bath can include $CuSO_4$, HCl, $H_2SO_4$, suppressor(s) and additives. In one embodiment, the ECP solution is maintained at a temperature of about 20–40° C. and a pH in the range of about 1–7. The current density of the ECP solution can be about 3–60 $mA/cm^2$.

The first ECP process may be continued for a duration of time or until via 14 is completely filled with a first copper layer 18 that also forms on the sidewalls and bottom of trench 15 but does not completely fill trench 15. The thickness "t1" of first copper layer 18 (see FIG. 2) within trench 15 can be devised to accommodate a desired outcome. The first copper layer 18 within trench 15 may conform to the shape of the copper seed layer 17. In one embodiment, thickness t1 of first copper layer 18 is equivalent to the distance from the top of seed layer 17 shown as dashed line A to a level indicated by dashed line B. A similar thickness t1 can be formed on the sidewalls of trench 15.

Figure 5:
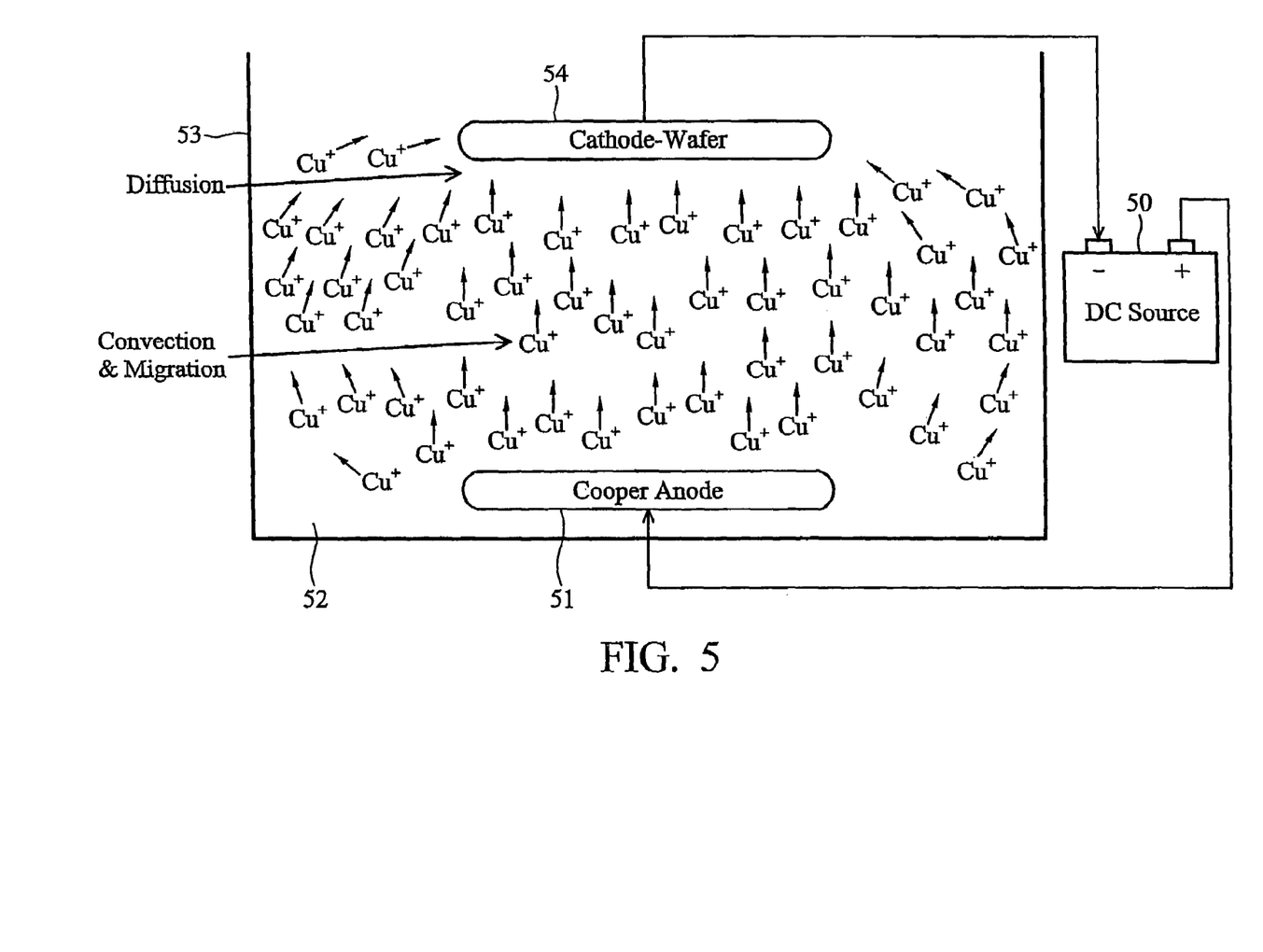
FIG. 5 shows a schematic representation of a conventional electroplating mechanism.

FIG. 5 shows a schematic representation of a conventional electroplating system. Different types conventionally known electroplating cells may be employed for the first ECP process. In one embodiment, DC current 50 is applied to a copper anode 51 in the electroplating solution 52 within the electroplating cell 53 where Cu is converted to $Cu^{2+}$ ions that migrate to the cathode 54. Put in the context of the embodiment of FIG. 2, cathode 54 may be the copper seed layer 17. The cathode 54 is where $Cu^{2+}$ ions react with the electrons to form and subsequently deposit Cu. Thus, the following reaction is conducted:

Conventional electroplating solutions contain sulfur (S) in the form of sulfates, chlorine (Cl) from hydrochloric acid "HCL" or other chlorine-containing additives and C from carbon-containing additives. Trace amounts of S, Cl, and C are easily trapped within first copper layer 18 and become a source of contamination unless removed.

According to one embodiment of the disclosure, a first annealing step is performed by heating substrate 10 to about 180–200° C. for about 30 seconds to remove S, Cl and C impurities from first copper layer 18. According to one embodiment of the disclosure, the disclosure is that the trench 15 and via 14 are not simultaneously filled in the first ECP process. The incomplete fill of trench 15 enables impurities in via 14 to be more easily removed in the first anneal step. A small grain size of equal or less than about 1 micron can be formed in the first ECP process to improve via fill capability. The first anneal step can increase the copper grain size in first copper layer 18 to equal or less than about 1 microns. The larger grain size after the first anneal step is desirable as it improves the electrical properties of first copper layer 18.

Figure 3:
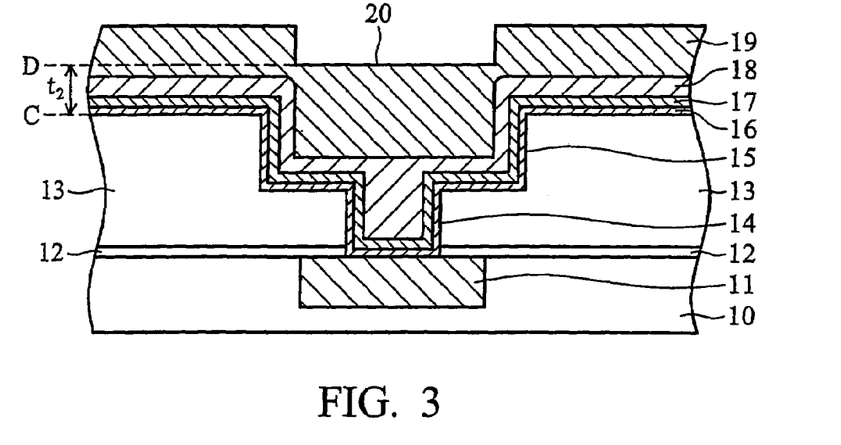
FIG. 3 shows the substrate of FIG. 2 having a second copper layer deposited thereon.

According to another embodiment, a second ECP process is used to deposit a second copper film. FIG. 3 shows the substrate of FIG. 2 having a second copper layer deposited thereon. Referring to FIG. 3, second copper layer 19 is deposited on first copper layer 18, for example using an ECP process or a sputtering technique. The second ECP process can be performed with an electroplating solution that does not contain HCl or a carbon based additive to avoid contaminants in copper layer 19. The duration and the intensity of the second ECP process can be adjusted according to the desired outcome.

The top surface of second copper layer 19 may be uneven having a low section 20 above trench 15 (in a plane indicated by dashed line D.) As used herein, the bottom surface is used to refer to the surface of a layer formed first in a deposition process while a top surface is understood to refer to the surface of a layer that is formed last in a deposition process. A top or bottom surface may be formed in a plane parallel or perpendicular to the substrate 10. Furthermore, a top or bottom surface may be divided into a plurality of sections in which one or more sections are in a plane perpendicular to substrate 10 and one or more sections are in a plane parallel to substrate 10. Thickness "t2" of section 20 in the top surface of second copper layer 19 above the level of dielectric layer 13 is the distance between dashed line D and dashed line C where C is a plane that is coplanar with the top surface of dielectric layer 13. Thickness $t_2$ can be devised to ensure that trench 15 is completely filled by second copper layer 19 above first copper layer 18.

To remove any impurity, a second annealing process may be performed. The device shown in FIG. 3, can be annealed at about 180–200° C. for a duration to remove trace amounts of Cl, C and S impurities as well as any other impurity. The second anneal step may also decrease the copper grain size in second copper layer 19 to about 2 microns. The smaller grain size improves the electrical properties of copper layer 19. The first and second annealing steps can be varied so as to obtain different grain sizes for each of copper layers 18 and 19.

In an alternative embodiment, a copper sputtering process may be used to deposit one or both of the copper layers 18 and 19. Copper sputtering is also known as physical vapor deposition (PVD). A PVD method has the advantage of forming second copper layer 19 without introducing impurities identified above. However, PVD typically has a lower deposition rate than an ECP process.

In an embodiment of the disclosure where PVD technique is employed to deposit copper layer 19, a second anneal step can be performed at a temperature of about 180–200° C. for about 30 seconds to increase copper grain size of copper layer 19 and to form a smooth interface between first and second copper layers 18 and 19, respectively.

Figure 4:
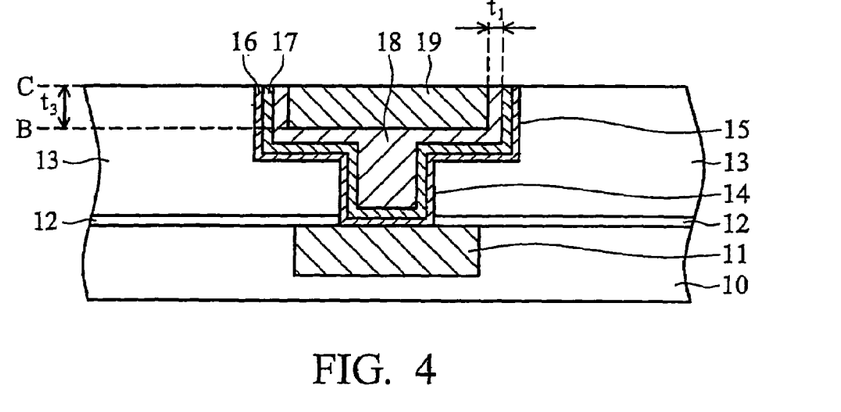
FIG. 4 schematically illustrates a semiconductor device prepared according to a two-step deposition process.

Referring to FIG. 4, the dual damascene scheme is completed by a planarization method that may be a chemical-mechanical polishing (CMP) process. The CMP process may involve more than one step. For example, a first CMP step may be used to remove first copper layer 18, second copper layer 19 and copper seed layer 17 above dielectric layer 13. A second CMP step may be employed to remove diffusion barrier layer 16 above dielectric layer 13. A third CMP step called a buffing step may be used to polish dielectric layer 13 and the exposed top surfaces of diffusion barrier 16, copper seed layer 17, first copper layer 18 and second copper layer 19 within trench 15 to form a smoother exposed top surface for each of the aforementioned layers and remove scratches from previous CMP steps. As a result of the CMP process, the exposed top surfaces of diffusion barrier layer 16, copper seed layer 17, first copper layer 18 and second copper layer 19 become coplanar with dielectric layer 13. Note that copper seed layer 17 may be too thin to be distinguishable from first copper layer 18 when the device is cross-sectioned to provide a view as in FIG. 4 during analysis by a scanning electron microscope (SEM) technique. In addition to an exposed top surface, diffusion barrier layer 16 and copper seed layer 17 can have a top surface within via 14 and trench 15 and first copper layer has a top surface within trench 15.

As shown, second copper layer 19 can have a bottom surface comprised of sections that are essentially perpendicular to the surface of substrate 10 and a section that is parallel to the surface of substrate 10. Second copper layer 19 has a thickness $t_3$ of a desired range within trench 15. The thickness $t_3$ represents the distance between the planarized top surface and the section of the bottom surface that is parallel to the surface of substrate 10.

In one embodiment, the disclosure provides a smaller grain size in first copper layer 18 and second copper layer 19 produced as a result of the two step deposition sequence. A small grain size after the second anneal step enables the CMP process to have a wider process window which reduces the cost of the polishing process. In addition, the CMP process is able to produce smoother top surface of first copper layer 18 and of second copper layer 19 by reducing the copper grain size on the exposed sections of the top surface of the aforementioned copper layers to less than 2 microns compared with approximately 2 microns in prior art. Another advantage is that the interconnect comprised of copper seed layer 17, first copper layer 18 and second copper layer 19 has a lower impurity content than copper interconnects fabricated by conventional ECP processes. In addition, the interconnect of the present invention may have a fewer copper defects than an interconnect formed by conventional dual damascene methods.

In another embodiment, the present invention is directed to a copper interconnect structure formed on a semiconductor substrate 10 as depicted in FIG. 4. Substrate 10 has a surface or side on which a semiconductor device will be fabricated. The copper interconnect structure is formed in a via 14 and an overlying trench 15 that are lined with a conformal diffusion barrier layer 16. The via 14 and trench 15 are formed in a stack of dielectric layers that in one embodiment encompasses a dielectric layer 13 formed on an etch stop layer 12. Via 14 and trench 15 each have a bottom, sidewalls and a top. The bottom of via 14 contacts the upper surface of an underlying conductive layer 11 in substrate 10. The bottom surface is the surface of a layer that is formed first in a deposition process and a top surface is the surface of a layer that is formed last in a deposition process, or alternatively, by a CMP process. A top or bottom surface may be formed in a plane that is parallel or perpendicular to the surface of substrate 10. Furthermore, a top or bottom surface may be divided into a plurality of sections in which one or more sections are in a plane that is perpendicular to the surface of substrate 10 and one or more sections are in a plane that is parallel to the surface of substrate 10.

The sidewalls of the via 14 and trench 15 are preferably vertical (i.e., perpendicular to the surface of substrate 10) and are lined with a conformal diffusion barrier layer 16 that also covers the bottom of via 14 and trench 15. The bottom of trench 15 is preferably parallel to the surface of substrate 10 and can be interrupted only by an opening for via 14. Optionally, the via 14 and trench 15 are formed in a stack of dielectric layers comprised of an upper cap layer (not shown) such as silicon carbide, silicon oxynitride, or silicon nitride, a middle dielectric layer 13 and a lower etch stop layer 12. In yet another embodiment (not illustrated) the stack of dielectric layers is formed by sequentially coating a first etch stop layer, a first dielectric layer, a second etch stop layer, a second dielectric layer and a cap layer on substrate 10. In this embodiment, the overlying trench is formed in the cap layer and extends through the second dielectric layer while the via extends from the second etch stop layer through the first dielectric layer and through the first etch stop layer.

Substrate 10 is preferably silicon but may also be based on silicon-germanium, gallium-arsenide, or silicon-on-insulator technology. Conductive layer 11 may include a metal such as Al, Cu, W, or an Al/Cu alloy. In an alternative embodiment, conductive layer 11 is enclosed on the sides and bottom by a diffusion barrier layer (not shown) within substrate 10. Etch stop layer 12 is preferably comprised of silicon nitride, silicon carbide, or silicon oxynitride. Dielectric layer 13 may include SiO2, PSG, BPSG, or a material having a low dielectric constant such as fluorine doped SiO2, carbon doped SiO2, a poly (arylether), a polysilsesquioxane, or a fluorinated polyimide.

The copper interconnect structure may include a conformal copper seed layer 17 formed on the diffusion barrier layer 16, a first copper layer 18 formed on the copper seed layer 17 and which fills the via 14 and partially fills the trench 15 and a second copper layer 19 formed on the first copper layer 18 that fills the trench 15. Thus, the copper interconnect structure has vertical sidewalls, a first planar bottom that coincides with the bottom of the via 14, a second planar bottom that coincides with the bottom of the trench 15, and a planar top that is coplanar with the top surface of the dielectric layer 13. The top of the copper interconnect is comprised of planarized exposed top surfaces of diffusion barrier 16, copper seed layer 17, first copper layer 18, and second copper layer 19. Optionally, when a cap layer is included in the stack of dielectric layers the copper interconnect is coplanar with the top surface of the cap layer.

Diffusion barrier layer 16 is preferably comprised of one or more of Ta, TaN, Ti, TiN, TaSiN, W, or WN. In addition to an exposed top surface, diffusion barrier layer 16 may have a top surface within via 14 and within trench 15. Copper seed layer 17 can have a thickness between about 600–2000 Angstroms and can be formed as a conformal layer on the top surface of diffusion barrier layer 16. In one embodiment, the copper seed layer 17 may be thin enough so that it is not distinguishable from first copper layer 18 when the interconnect is cross-sectioned to provide a cross-sectional view as illustrated in FIG. 4. In addition to an exposed top surface, copper seed layer 17 may have a top surface within via 14 and trench 15.

In one embodiment, the first copper layer 18 may partially fill trench 15 and have a thickness equivalent to the distance between the top surface of copper seed layer 17 (indicated by dashed line A to a level represented by dashed line B.) As shown in FIG. 4, the first copper layer 18 within trench 15 can be formed as a conformal layer on the top surface of the copper seed layer 17. Thus, a similar thickness t1 of first copper layer 18 can be formed on copper seed layer 17 along the sidewalls of trench 15. In addition to an exposed top surface, first copper layer 18 can have a top surface within trench 15.

The top surface of first copper layer 18 within trench 15 forms a smooth interface with the bottom surface of the second copper layer 19. Second copper layer 19 has a planarized and exposed top surface that is coplanar with the top surface of dielectric layer 13 and has a bottom surface comprised of sections that are essentially perpendicular to the surface of substrate 10 and a section that is parallel to the surface of substrate 10. In one embodiment, the grain sizes for first copper layer 18 & the second copper layer 19 can be about 1 micron.

Figure 6A:
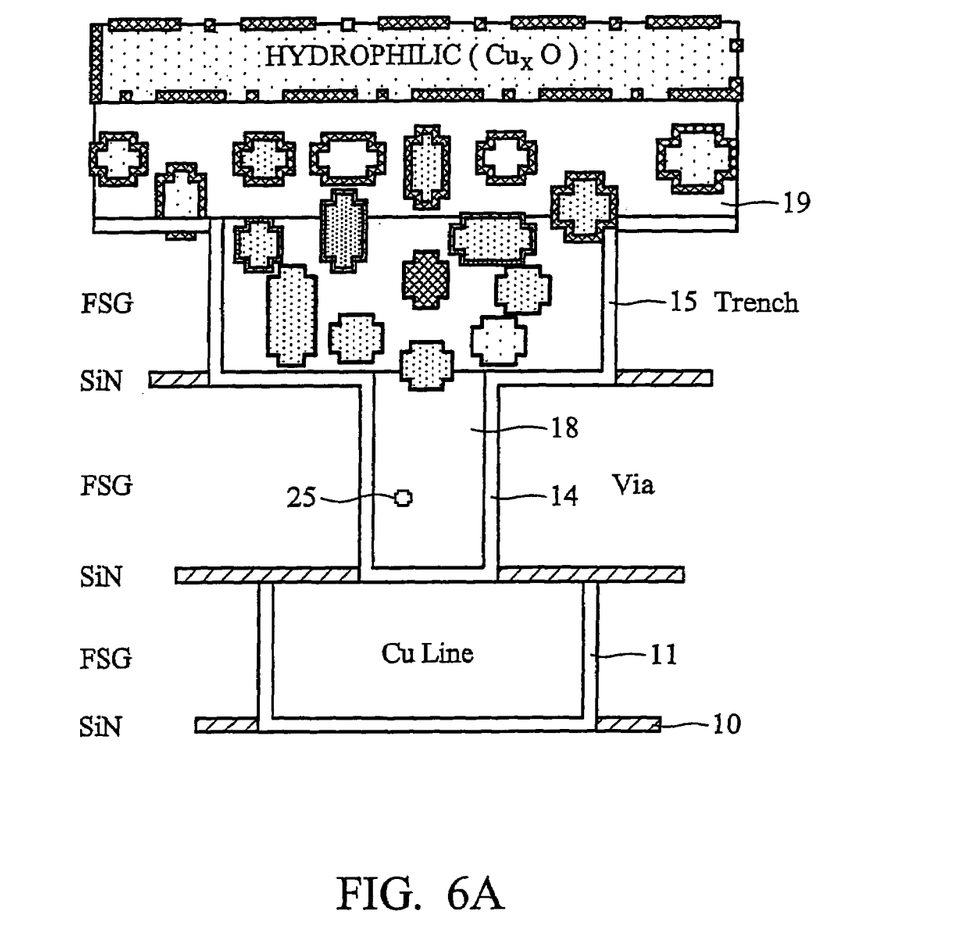
FIG. 6 shows copper film quality enhancement with two-step deposition according to one embodiment of the disclosure.
Figure 6B:
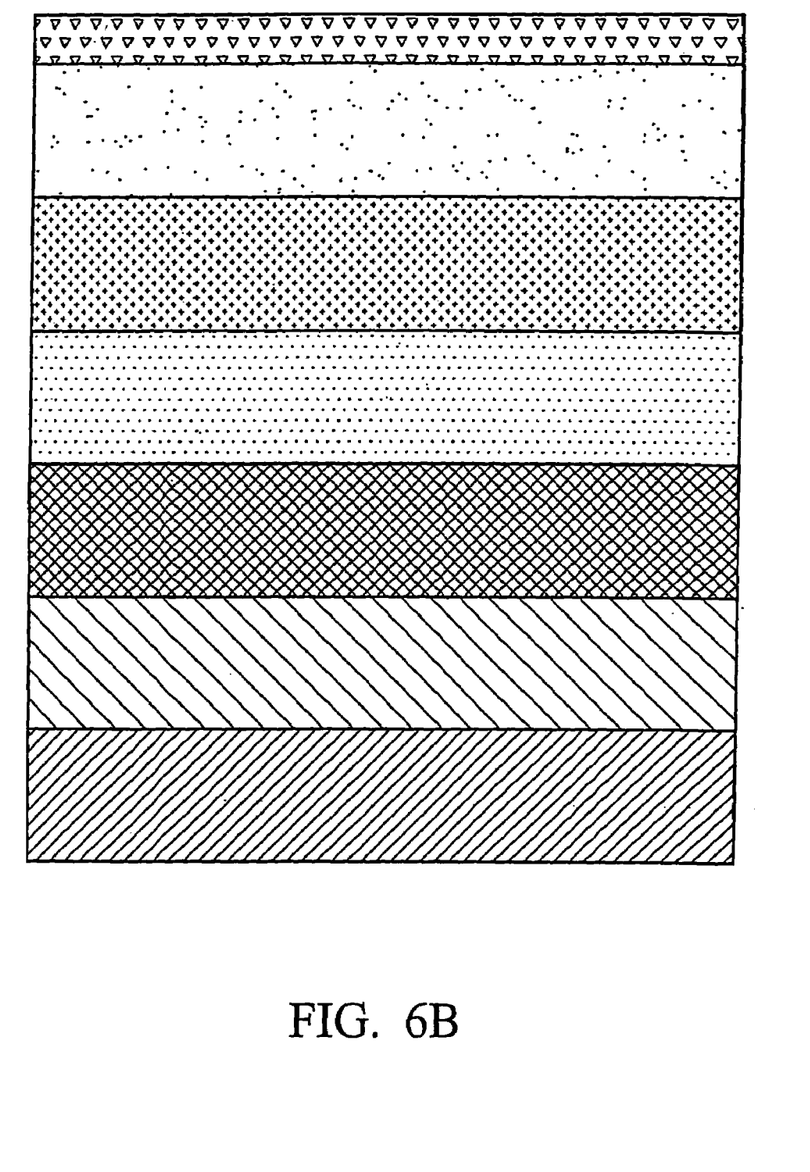

FIG. 6 shows Copper film quality enhancement with two-step deposition according to one embodiment of the disclosure. Referring to FIG. 6A, a defect forming mechanism is numbered consistent with schematic representations of FIGS. 1–4. In FIG. 6A, substrate 10 is shown to have copper interconnect line 11, in electromagnetic communication with via 14 and trench 15. The first copper layer 18 has undergone ECP deposition and annealing as disclosed with respect to FIGS. 1–4. Consequently, defect 25 is sparse and small. On the other hand, trench 15 is deposited with second copper layer 19 and includes larger copper grains 25 and more defects. FIG. 6B shows grain boundary for the various copper layers of FIG. 6A. The figure demonstrate the Cu grain size profile in the metal line after two-step electroplating.

Figure 7A:
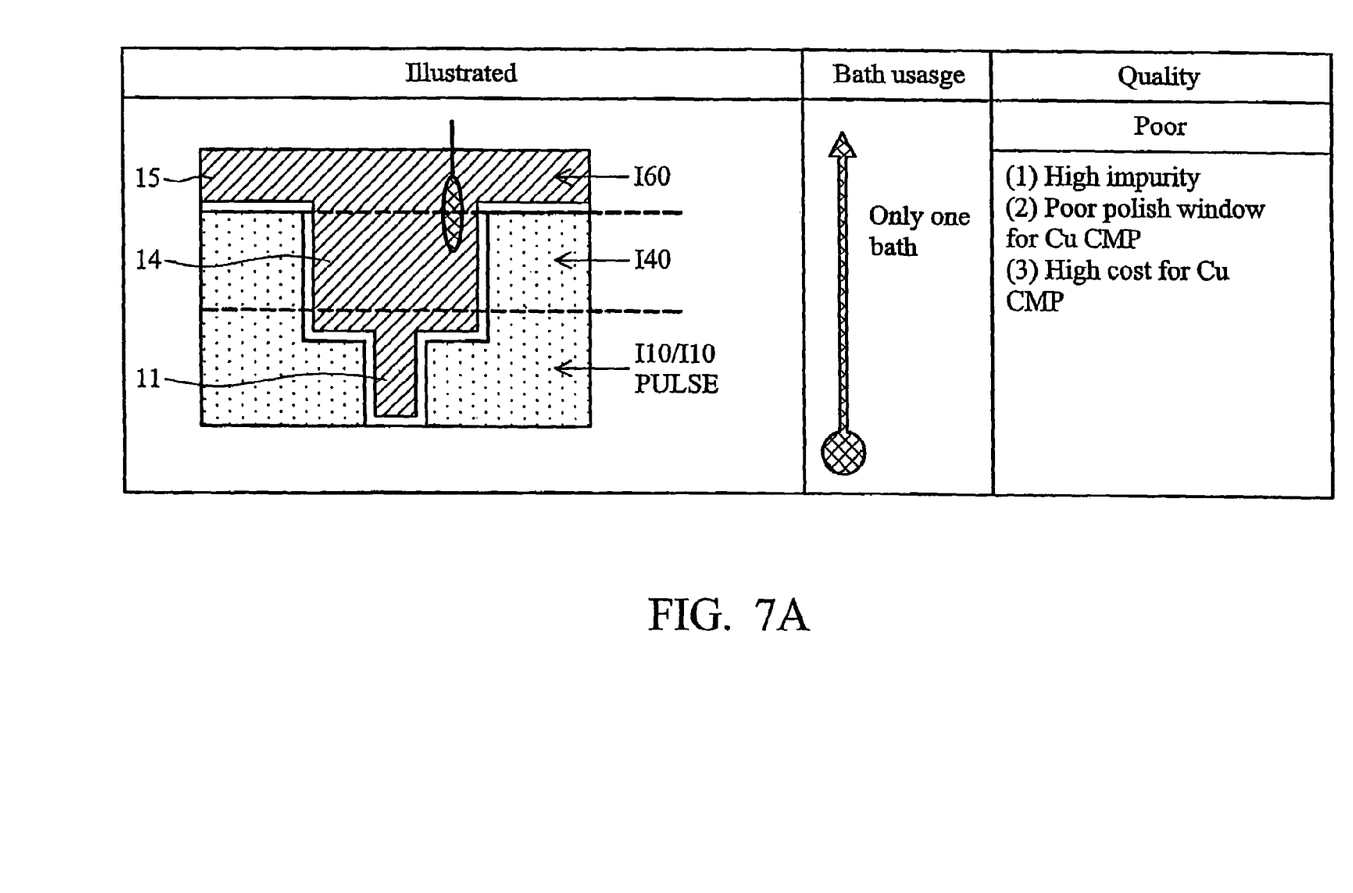
FIG. 7 comparatively shows enhancement obtained by a two-step deposition according to one embodiment of the disclosure.
Figure 7B:
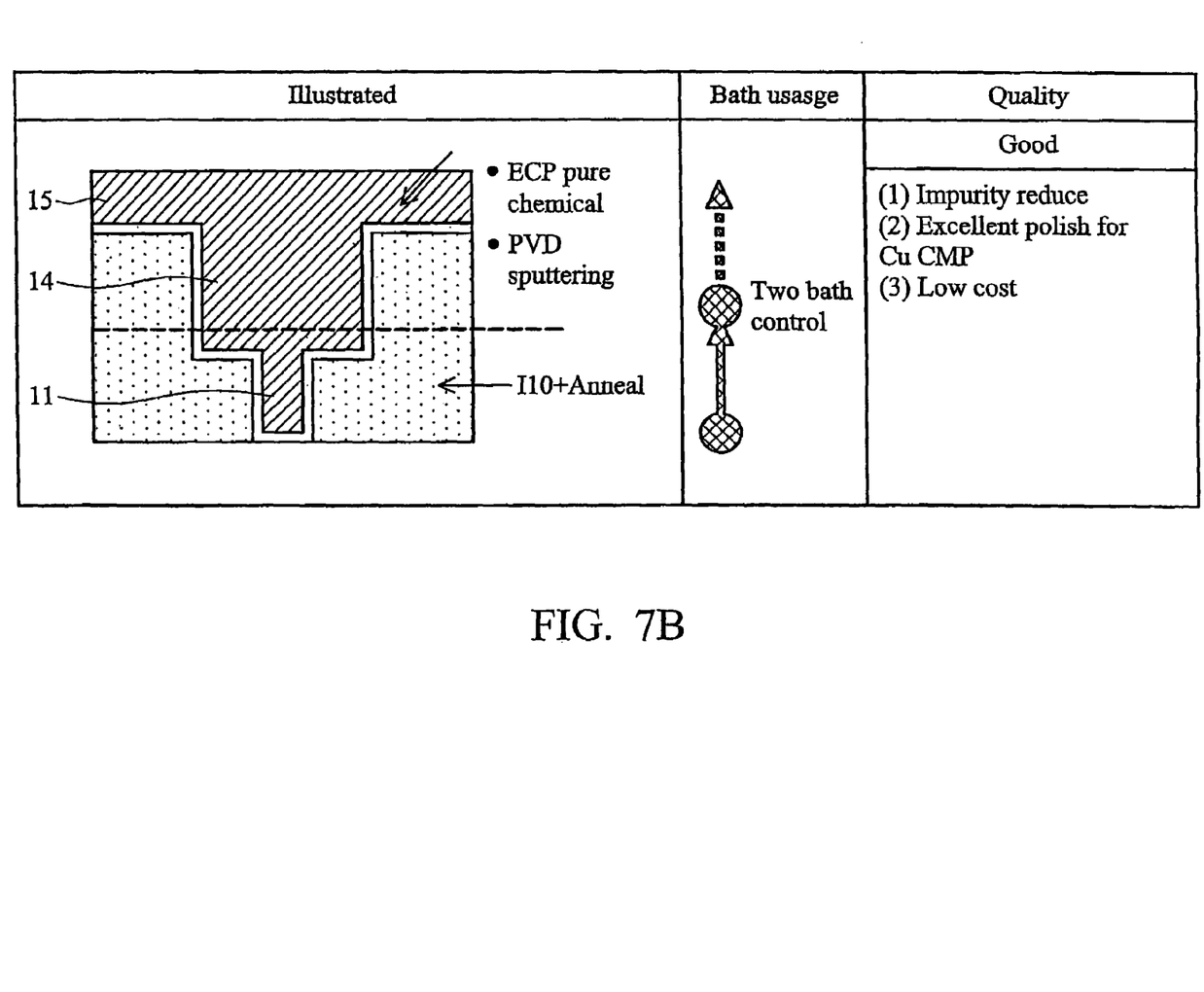
Figure 8A:
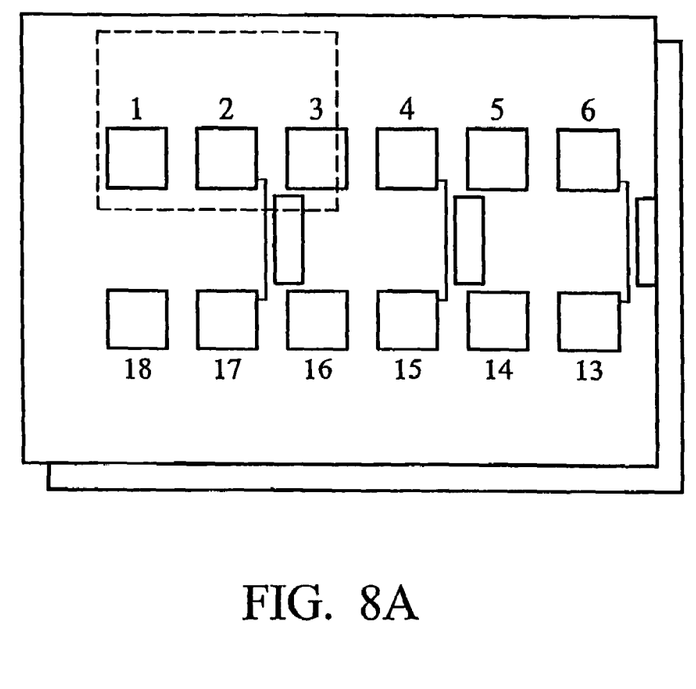
FIG. 8 shows exemplary grain sizes of copper.
Figure 8B:
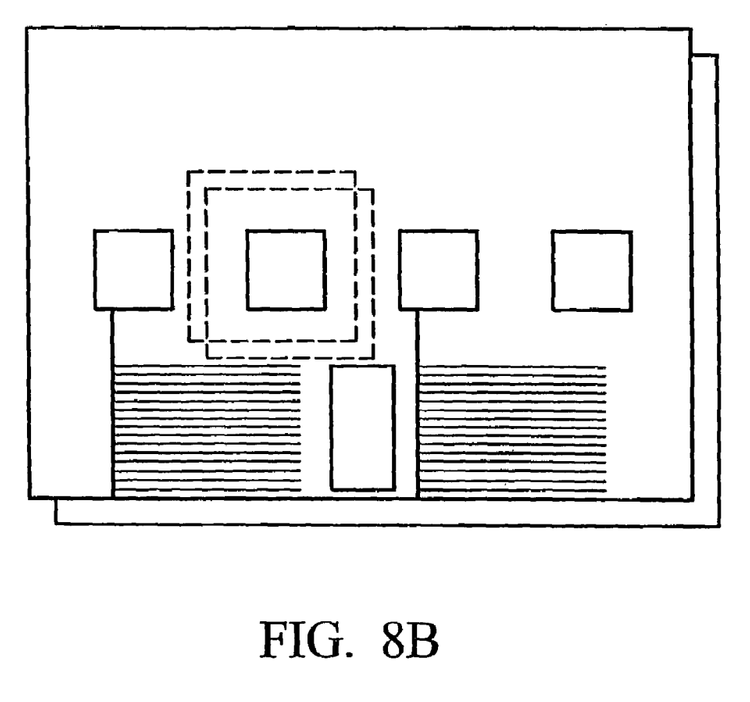
Figure 8C:
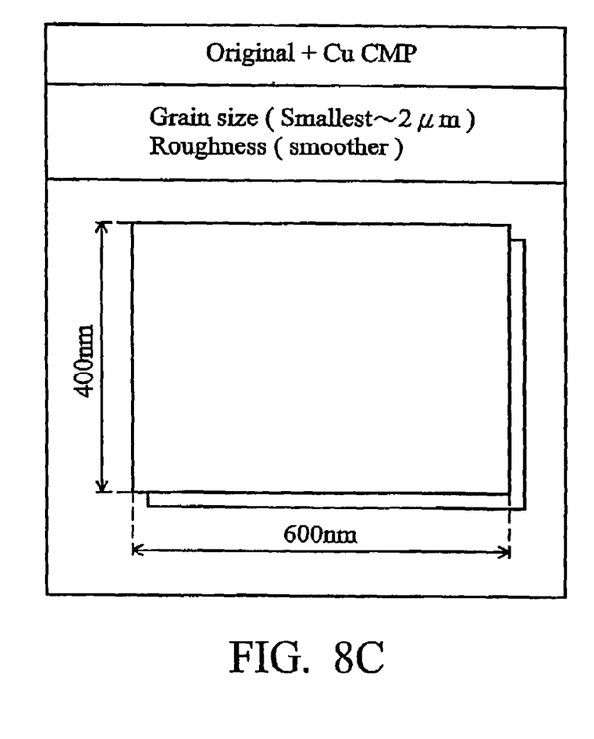
Figure 8D:
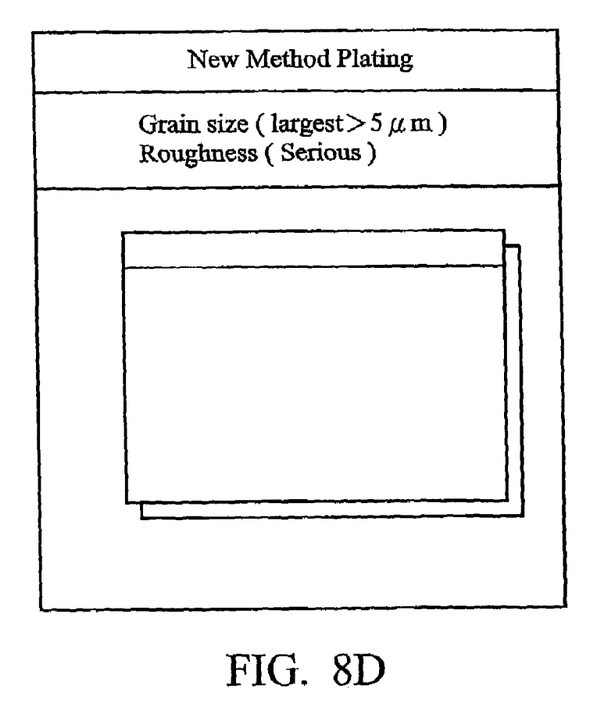
Figure 8E:
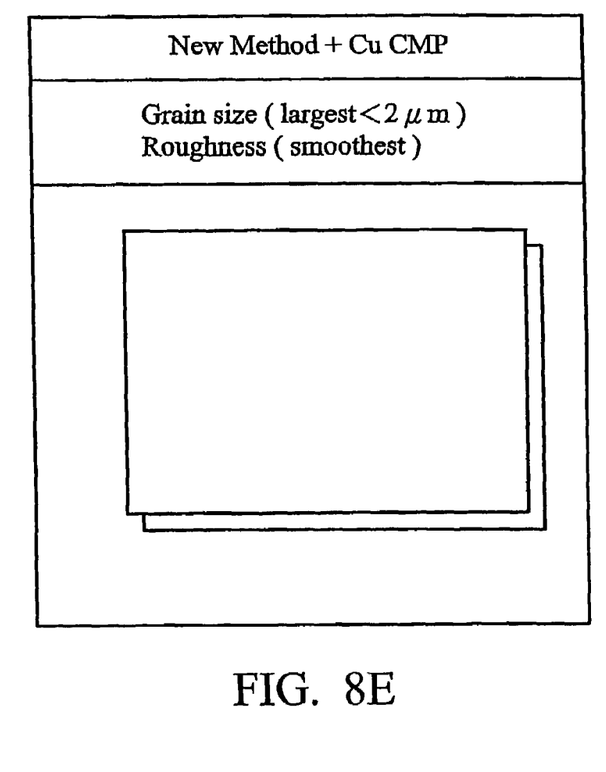

FIG. 7 comparatively shows enhancement obtained by a two-step deposition according to one embodiment of the disclosure. Referring to embodiment of FIG. 7A, a conventional deposition is performed wherein conductive layer 11 has I10 copper while each of via 14 and trench 15 have deposited therein, respectively, I40 and I60 copper. The embodiment of FIG. 7A was prepared through a single ECP deposition (i.e., only one bath usage). The result was a copper film having high impurity, a poor polish window for CMP and a relatively high cost for the Cu CMP. On the other hand, the Cu film of FIG. 7B was deposited with a two-step deposition in accordance with the embodiments disclosed herein. The copper seed layer 11 was deposited and annealed. Then, via 14 was filled by sputtering (CVD), followed by filling trench 15 through ECP. The results included reduced impurity, excellent polish for Cu CMP and a relatively lower CMP cost.

The principles disclosed herein may be applied with similar benefits for the fabrication of interconnects in logic devices, memory devices, microelectromechanical devices and other related technologies. Moreover, the method of the present invention may be repeated a plurality of times on the same substrate to form a succession of copper interconnect layers that are stacked in various designs.

FIG. 8 shows exemplary grain sizes of copper. In FIG. 8A, circuit 80 is shown to have twelve chips numbered 1–13. FIG. 8B is an enlarged representations of chip No. 2 of FIG. 8A. FIG. 8C shows chip No. 2 prepared according to conventional methods of Copper deposit and CMP. The smallest grains are about 2 μm and the surface is relatively smooth. In FIG. 8D chip No. 2 is prepared according to the principles disclosed herein. The largest grain size is greater than 5 μm and the surface us rough. In FIG. 8E, copper is deposited in accordance with the principles disclosed herein and the deposition is followed by CMP. The grain size of the largest copper particles of FIG. 8E is less than 2 μm and the surface is smooth. Comparing the grain size shown in FIG. 8E and that of FIG. 8C, it can be readily seen that the embodiments disclosed herein provide substantially smaller grain size and smoothers surface.

While the disclosure has been discussed in reference to embodiments shown herein, it is important to note that the principles of the disclosure are not limited thereto and include permutations and modifications not specifically disclosed.

What is claimed is:

1. In a process for forming a copper interconnect in a semiconductor substrate having a via and a trench in a dual damascene structure, the process comprising:
    forming a via and a trench on the semiconductor substrate;
    using a first electrochemical plating process, depositing a first copper layer in the via;
    annealing the first copper layer in the via to remove impurities including carbon;
    depositing a second copper layer in the trench, the second copper layer substantially free of HCl/C-based additives; and
    annealing the second copper layer to improve grain size and surface roughness.

2. The process of claim 1, wherein the step of depositing a second copper layer further comprises performing an electrochemical plating substantially free from HCl/C to avoid impurities caused by chlorine or carbon.

3. The process of claim 1, wherein the step of depositing a second copper layer further comprises sputtering the second copper layer in the trench.

4. In a process for forming one or more copper (Cu) film on a substrate the Cu film substantially free from defects and impurities, the process comprising:
    providing a substrate (10) having formed therein a first conductive layer (11);
    depositing an etch stop layer and a dielectric layer over the substrate, the etch-stop layer and the dielectric having a via (14) and a trench (15) positioned to expose the first conductive layer (11);

depositing a diffusion barrier layer (16) and a Cu seed layer (17) to cover at least a portion of the via (14) and the trench (15);

depositing a first Cu layer (17) to at least partially fill the via (14);

annealing the first Cu layer (17) at about 180–200° C. to remove a first impurity;

depositing a second Cu layer (19) to at least partially fill the trench (15); and annealing the first Cu layer (17) and the second Cu layer (19) at about 180–200° C. to remove a second impurity;

wherein the step of depositing a second Cu layer includes electrochemical plating copper substantially free of HCl and C-based additives to avoid carbon and chlorine impurities.

5. The method of claim 4, wherein the step of depositing a second Cu layer further comprises electrochemical plating copper.

6. The method of claim 4, wherein the step of depositing a second Cu layer further comprises sputtering.

7. The method of claim 4, wherein the step of depositing a second Cu layer further comprises sputtering, the sputtering process substantially free of C, Cl and S impurities.

8. The method of claim 4, wherein the step of annealing the first Cu layer is carried out for about 1–10 minutes.

9. The method of claim 4, wherein the step of annealing the first and the second Cu layer is carried out for about 1–10 minutes.

10. The method of claim 4, wherein the first conductive layer (11) is selected from the group consisting of Al, Cu, W and alloys thereof.

11. A semiconductor device prepared according to the method of claim 4.

12. A process for forming one or more Cu film substantially free from defects and impurities on a substrate, the process comprising:

providing a substrate (10) having formed therein a first conductive layer (11);

depositing an etch stop layer and a dielectric layer over the substrate, the etch-stop layer and the dielectric having a via (14) and a trench (15) positioned to expose the conductive layer (11);

depositing a diffusion barrier layer (16) and a Cu seed layer (17) to cover at least a portion of the via (14) and the trench (15);

depositing a first Cu layer (17) to at least partially fill the via (14);

annealing the first Cu layer (17) at about 180–200° C. to remove a carbon impurity;

depositing a second Cu layer (19) to at least partially fill the trench (15), the second Cu layer deposited through electrochemical plating free of HCL and C-based additive; and annealing the first Cu layer (17) and the second Cu layer (19) at about 180–200° C. to removed additional impurities.

13. The process of claim 12, further comprising depositing a seed layer.

14. The process of claim 13, wherein the seed layer further comprises copper.

15. The process of claim 12, wherein the conductive layer further comprises aluminum, copper, tungsten or an alloy of aluminum and copper.

16. A process for forming one or more Cu film substantially free from defects and impurities on a substrate, the process comprising:

providing a substrate (10) having formed therein a first conductive layer (11);

depositing an etch stop layer and a dielectric layer over the substrate, the etch-stop layer and the dielectric having a via (14) and a trench (15) positioned to expose the conductive layer (11);

depositing a diffusion barrier layer (16) and a Cu seed layer (17) to cover at least a portion of the via (14) and the trench (15);

depositing a first Cu layer (17) to at least partially fill the via (14);

annealing the first Cu layer (17) at about 180–200° C. to remove a carbon impurity;

depositing a second Cu layer (19) to at least partially fill the trench (15), the second Cu layer deposited through sputtering free of C, Cl and S; and annealing the first Cu layer (17) and the second Cu layer (19) at about 180–200° C. to removed additional impurities.

17. The process of claim 16, further comprising depositing a seed layer.

18. The process of claim 17, wherein the seed layer further comprises copper.

19. The process of claim 16, wherein the conductive layer further comprises aluminum, copper, tungsten or an alloy of aluminum and copper.

20. A semiconductor device prepared according to the process of claim 16.

21. A method for forming a copper interconnect in a damascene structure comprising:

forming an opening on a substrate;

depositing a first copper layer in the opening using a first plating electrolyte, wherein the electrolyte further comprises chloride ion and carbon-containing additive; and depositing a second copper layer in the opening using a second plating electrolyte, wherein the second electrolyte is substantially free from chloride ion and carbon-containing additives.

22. The method of claim 21, further comprising annealing the opening after depositing a first copper layer in the opening.

23. The method of claim 21, further comprising annealing the opening after depositing a second copper layer in the opening.

24. The method of claim 21, wherein the step of depositing a second copper layer further comprises sputtering the second copper layer in the opening.

25. A semiconductor device prepared according to the process of claim 21.

26. In a process for forming a copper interconnect in a semiconductor substrate having a via and a trench in a dual damascene structure, the process comprising:

forming a via and a trench on the semiconductor substrate;

using a first electrochemical plating process, depositing a first copper layer in the via, annealing the via to remove impurities including carbon;

depositing a second copper layer in the trench, the second copper layer substantially free of HCl/C-based additives; and annealing the via to improve grain size and surface roughness;

wherein the step of depositing a second copper layer further comprises performing an electrochemical plating substantially free from HCl/C to avoid impurities caused by chlorine or carbon.

27. In a process for forming one or more copper (Cu) film on a substrate the Cu film substantially free from defects and impurities, the process comprising:
   providing a substrate (10) having formed therein a first conductive layer (11);
   depositing an etch stop layer and a dielectric layer over the substrate, the etch-stop layer and the dielectric having a via (14) and a trench (15) positioned to expose the first conductive layer (11);
   depositing a diffusion barrier layer (16) and a Cu seed layer (17) to cover at least a portion of the via (14) and the trench (15);
   depositing a first Cu layer (17) to at least partially fill the via (14);
   annealing the first Cu layer (17) at about 180–200° C. to remove a first impurity;
   depositing a second Cu layer (19) to at least partially fill the trench (15); and
   annealing the first Cu layer (17) and the second Cu layer (19) at about 180–200° C. to remove a second impurity;
   wherein the step of depositing a second Cu layer further comprises sputtering, the sputtering process substantially free of C, Cl and S impurities.

28. A process for forming one or more Cu film substantially free from defects and impurities on a substrate, the process comprising:
   providing a substrate (10) having formed therein a first conductive layer (11);
   depositing an etch stop layer and a dielectric layer over the substrate, the etch-stop layer and the dielectric having a via (14) and a trench (15) positioned to expose the conductive layer (11);
   depositing a diffusion barrier layer (16) and a Cu seed layer (17) to cover at least a portion of the via (14) and the trench (15);
   depositing a first Cu layer (17) to at least partially fill the via (14);
   annealing the first Cu layer (17) at about 180–200° C. to remove a carbon impurity;
   depositing a second Cu layer (19) to at least partially fill the trench (15), the second Cu layer deposited through sputtering free of C, Cl and 5; and
   annealing the first Cu layer (17) and the second Cu layer (19) at about 180–200° C. to removed additional impurities;
   wherein the step of depositing a second Cu layer further comprises sputtering, the sputtering process substantially free of C, Cl and S impurities.

* * * * *

UNITED STATES PATENT AND TRADEMARK OFFICE
CERTIFICATE OF CORRECTION

| | | |
|---|---|---|
| PATENT NO. | : 7,189,650 B2 | Page 1 of 1 |
| APPLICATION NO. | : 10/987713 | |
| DATED | : March 13, 2007 | |
| INVENTOR(S) | : Chi-Wen Liu, Hsien-Ping Feng and Jung-Chih Tsao | |

It is certified that error appears in the above-identified patent and that said Letters Patent is hereby corrected as shown below:

Column 10, line 62, delete "sufface" and insert therefor -- surface --.

Signed and Sealed this

Tenth Day of July, 2007

JON W. DUDAS
*Director of the United States Patent and Trademark Office*